(12) United States Patent
Lee et al.

(10) Patent No.: US 7,876,038 B2
(45) Date of Patent: Jan. 25, 2011

(54) ORGANIC LIGHT EMITTING DISPLAY

(75) Inventors: Hun-Jung Lee, Suwon-si (KR); Dong-Won Han, Suwon-si (KR); Steve Y. G. Mo, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 247 days.

(21) Appl. No.: 12/273,765

(22) Filed: Nov. 19, 2008

(65) Prior Publication Data

US 2009/0195148 A1 Aug. 6, 2009

(30) Foreign Application Priority Data

Feb. 4, 2008 (KR) ............... 10-2008-0011024

(51) Int. Cl.
*H01J 1/62* (2006.01)
(52) U.S. Cl. .................. 313/504; 257/10; 313/498
(58) Field of Classification Search ......... 313/498–512; 257/10
See application file for complete search history.

(56) References Cited

U.S. PATENT DOCUMENTS

2007/0170850 A1 7/2007 Choi et al.

FOREIGN PATENT DOCUMENTS

| JP | 2001-176670 | 6/2001 |
|---|---|---|
| JP | 2004-273614 | 9/2004 |
| KR | 2004-106923 | 12/2004 |
| KR | 635514 | 10/2006 |
| KR | 2007-25253 | 3/2007 |
| KR | 10-2008-0001185 | 1/2008 |
| KR | 2008-1188 | 1/2008 |
| KR | 10-0829760 | 5/2008 |

OTHER PUBLICATIONS

Office Action issued in corresponding Korean Patent Application No. 10-2008-0011024 dated Mar. 27, 2009.
Office Action issued Sep. 28, 2009, in corresponding Korean Application No. 10-2008-0011024.

*Primary Examiner*—Joseph L Williams
(74) *Attorney, Agent, or Firm*—Stein McEwen, LLP

(57) ABSTRACT

An organic light emitting display including: a driving thin film transistor (TFT) including a semiconductor layer on a substrate including a source electrode, a drain electrode, and an N-type oxide semiconductor; at least one insulating layer formed on the driving TFT; a pixel defining layer for defining a pixel region on the insulating layer; a cathode electrode coupled to a drain electrode of the driving TFT and patterned to correspond to the pixel region; an electron injection layer arranged over the entire surfaces of the pixel defining layer and the cathode electrode and formed of a material whose band gaps are 3.0 eV to 5.0 eV selected from the group consisting of an oxide, a nitride, a fluoride, and diamond on; an organic light emitting layer formed on the electron injection layer to correspond to the cathode region; and an anode electrode formed on the organic light emitting layer.

16 Claims, 3 Drawing Sheets

ORGANIC LIGHT EMITTING DISPLAY

CROSS-REFERENCE TO RELATED APPLICATION

This application claims the benefit of Korean Patent Application No. 2008-11024, filed Feb. 4, 2008 in the Korean Intellectual Property Office, the disclosure of which is incorporated herein by reference.

BACKGROUND OF THE INVENTION

1. Field of the Invention

Aspects of the present invention relate to an organic light emitting display, and more particularly, to an organic light emitting display including a thin film transistor (TFT) in which an N-type oxide semiconductor layer is formed.

2. Description of the Related Art

In a TFT of a conventional organic light emitting display, amorphous silicon or poly silicon is used as a semiconductor layer. However, when the semiconductor layer is formed of amorphous silicon, it is difficult to use the TFT as a driving circuit of a display panel that requires high operating speed because of low mobility in the amorphous silicon layer When the semiconductor layer is formed of poly silicon, mobility is high, but the threshold voltage is non-uniform. Thus, an additional compensating circuit is necessary. Moreover, a leakage current is generated by the TFT having a semiconductor layer of amorphous silicon or poly silicon because of the radiation of light so that the characteristics of the TFT deteriorate.

Therefore, oxide semiconductors are being studied to solve such problems. For example, Japanese Patent Publication No. 2004-273614 discloses a TFT that has a semiconductor layer formed of ZnO or an oxide semiconductor including ZnO. Referring to FIG. 1, the TFT includes a source electrode 20*a* and a drain electrode 20*b* formed on an insulating substrate S, a ZnO layer 4 provided to contact the source and drain electrodes 20*a* and 20*b*, and a gate insulating layer 5 and a gate electrode 6 laminated on the ZnO layer 4.

In this case, the ZnO or the oxide semiconductor including ZnO has a band gap of 3.4 eV, which is higher than light energy in the visible light region, and thus the ZnO does not absorb visible rays. Therefore, in the TFT, the leakage current caused by the absorption of visible light does not increase. However, it is generally the case that ZnO or an oxide semiconductor including ZnO exhibits N-type conductivity caused by the depletion of $O_2$, whereas an organic light emitting display uses a P-type driving element.

In another example, Korean Patent Registration No. 635514 discloses an organic light emitting display using a common P-type driving element. Referring to FIG. 2, a P-type driving TFT includes a gate electrode 40, a source electrode 50*a*, a drain electrode 50*b*, and a P-type semiconductor layer 60 formed on a substrate 30.

In this case, the source electrode 50*a* of the driving TFT is coupled to a common power source voltage line ELVDD 96, and the drain electrode 50*b* is coupled to the anode electrode 80 of an organic light emitting diode (OLED). An organic light emitting layer 90 is formed on the anode electrode 80, and a cathode electrode 92 formed on the organic light emitting layer 90 is coupled to a second power source voltage line 97, so that the organic light emitting display is driven. Reference numerals 93, 94, 98, and 99 that are not described further herein denote an insulating layer, a pixel defining layer, a sealing material, and an encapsulating substrate.

In order to use a driving TFT in which an N-type oxide semiconductor layer is used for an organic light emitting display, the structure of the anode electrode of the OLED and the structure of the cathode electrode thereof should be reversed. Therefore, it is necessary to improve the structure of an organic light emitting display, and thus studies are being carried out to improve the structure of organic light emitting displays.

SUMMARY OF THE INVENTION

In order to achieve the foregoing and/or other aspects of the present invention, an organic light emitting display according to an embodiment of the present invention includes: a substrate; a driving thin film transistor (TFT) on the substrate, the TFT including a semiconductor layer formed of a source electrode, a drain electrode, and an N-type oxide semiconductor; at least one insulating layer formed on the driving TFT; a pixel defining layer for defining a pixel region on the insulating layer; a cathode electrode coupled to a drain electrode of the driving TFT and patterned to correspond to the pixel region; an electron injection layer arranged on the cathode electrode over the entire surfaces of the pixel defining layer and the cathode electrode, and formed of a material whose band gaps are 3.4 eV to 5.0 eV selected from the group consisting of an oxide, a nitride, a fluoride, and diamond;, an organic light emitting layer formed on the electron injection layer to correspond to the cathode region; and an anode electrode formed on the organic light emitting layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
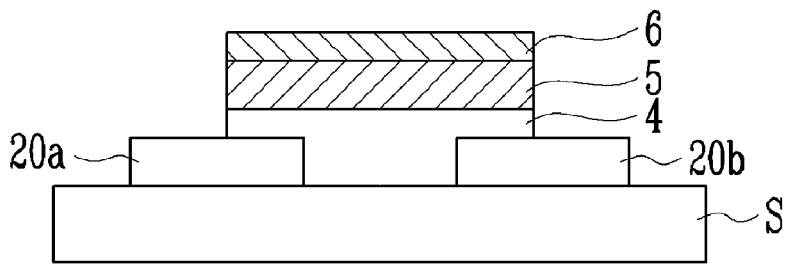
FIG. 1 is a cross-sectional view illustrating a thin film transistor (TFT) having a semiconductor layer of ZnO according to conventional art.
Figure 2:
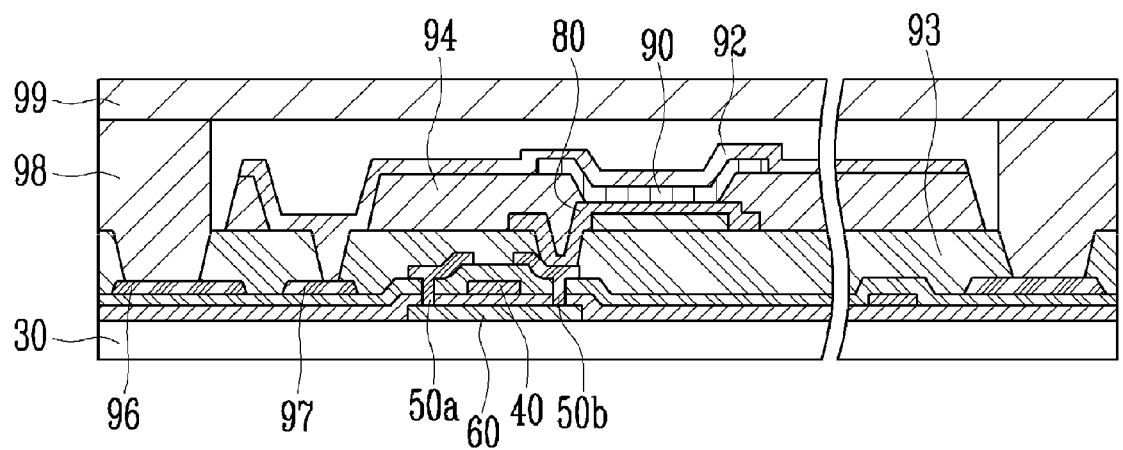
FIG. 2 is a cross-sectional view of an organic light emitting display illustrating the cross-sections of a driving TFT and a pixel region according to conventional art.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Moreover, it is to be understood that where it is stated herein that one layer is "formed on" or "disposed on" a second layer, the first layer may be formed or disposed directly on the second layer or there may be an intervening layer between the first layer and the second layer. Further, as used herein, the term "formed on" is used with the same meaning as "located on" or "disposed on" and is not meant to be limiting regarding any particular fabrication process.

Figure 3:
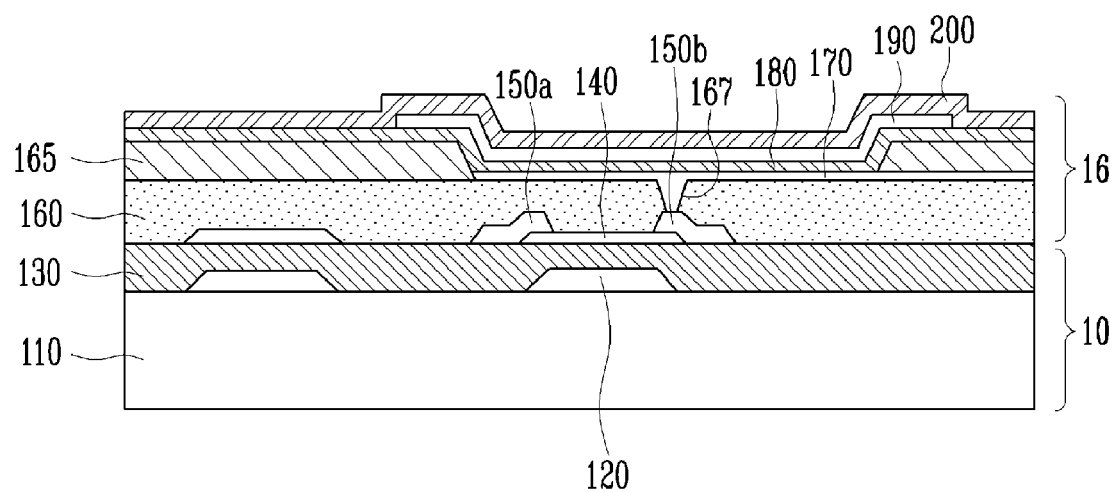
FIG. 3 is a cross-sectional view of an organic light emitting display illustrating the cross-sections of a driving TFT and a pixel region according to an embodiment of the present invention.

FIG. 3 is a cross-sectional view of an organic light emitting display 16 illustrating the cross-sections of a driving TFT 10 and a pixel region according to an embodiment of the present invention. In order to form an organic light emitting display using a driving TFT 10 in which an N-type oxide semiconductor layer is used, it is necessary to change the structure of conventional organic light emitting displays. That is, a cathode electrode is to be coupled to a drain electrode of a driving TFT 10 in order to use an N-type driving TFT 10.

In a driving TFT 10 having an inverted staggered structure, a gate electrode 120 is formed on a region on a substrate 110, and a gate insulating layer 130 is formed on the gate electrode 120 and the substrate 110. In addition, a semiconductor layer 140 is formed to correspond to the gate electrode 120 on a region of the gate insulating layer 130, and source and drain electrodes 150a and 150b contact different regions of the semiconductor layer 140.

In this embodiment, the semiconductor layer 140 is formed of an N-type oxide semiconductor. The N-type oxide semiconductor can be formed of an oxide selected from the group consisting of ZnO, $ZnGa_2O_4$, $ZnIn_2O_4$, $In_2O_3$, $ZnInGaO_4$, and $ZnSnO_4$. The above materials exhibit N-type electrical characteristics because of the depletion of $O_2$.

An insulating layer 160 is provided on a driving TFT 10 array to protect the driving TFT 10 and to separate an organic light emitting diode (OLED) formed on the insulating layer 160 from the driving TFT 10. Here, although one insulating layer 160 is illustrated in the drawing, both an organic insulating layer and an inorganic insulating layer referred to as a planarizing layer and a passivation layer may be commonly provided. The above-described TFT 10 array refers to all of the layers for forming the TFT 10. According to the present embodiment, the TFT 10 array refers to the gate electrode 120, the gate insulating layer 130, the semiconductor layer 140, and the source and drain electrodes 150a and 150b.

A pixel defining layer 165 is formed on the insulating layer 160 to define unit pixels, in which OLEDs are positioned and the OLEDs are formed. The OLED includes a cathode electrode 170 patterned in accordance with a pixel region, an electron injection layer 180 formed on the cathode electrode 170 and the pixel defining layer 165, an organic light emitting layer 190 formed on the electron injection layer 180 to correspond to the cathode electrode 170, and an anode electrode 200 formed on the organic light emitting layer 190.

The cathode electrode 170 contacts with the drain electrode 150b of the TFT 10 through a via hole 167, as the TFT 10 has the N-type electric characteristic. The cathode electrode 170 is patterned in accordance with the shape of the pixel region defined by the pixel defining layer through a photolithography process. The cathode electrode 170 is formed of one selected from the group consisting of indium tin oxide (ITO), Ag, and Al. In particular, ITO may be used for a transparent electrode for both-side emission. The ITO can also be doped with materials such as cesium.

The electron injection layer 180 is provided between the cathode electrode 170 and the organic light emitting layer 190. The electron injection layer 180 is used for helping the band bending of the OLED and for improving the efficiency of the OLED using the tunneling effect of electrons.

In a conventional OLED, the electron injection layer is formed under the cathode electrode. However, according to this embodiment of the present invention, the electron injection layer 180 is formed on the cathode electrode 170 that contacts with the drain electrode 150b since the TFT 10 for driving the OLED has N-type electric characteristics.

Figure 4A:
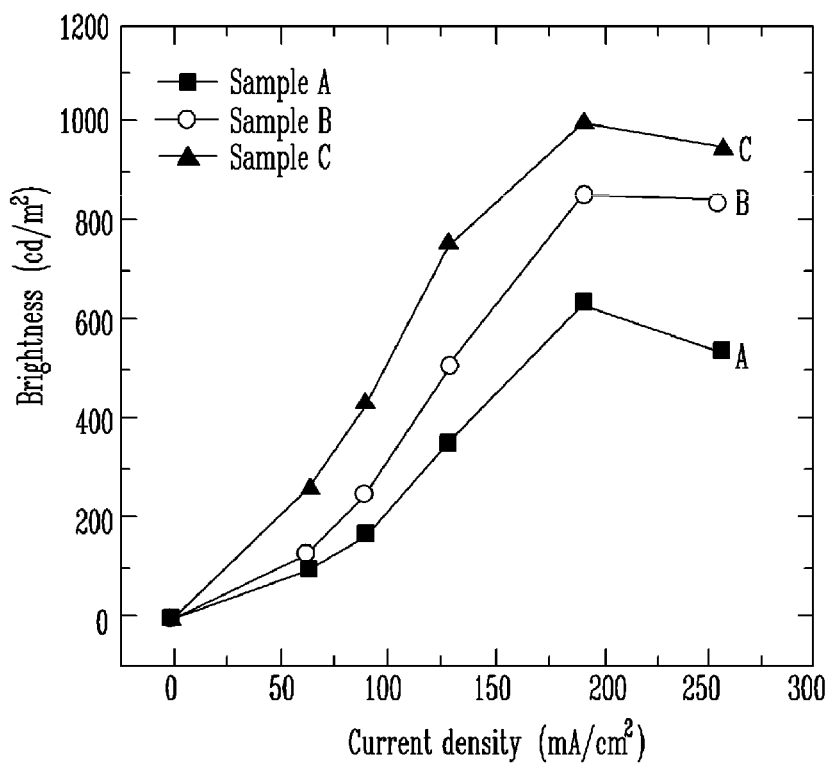
FIGS. 4A and 4B are graphs schematically illustrating the physical property values of organic light emitting displays as a function of the electron injection layer.
Figure 4B:
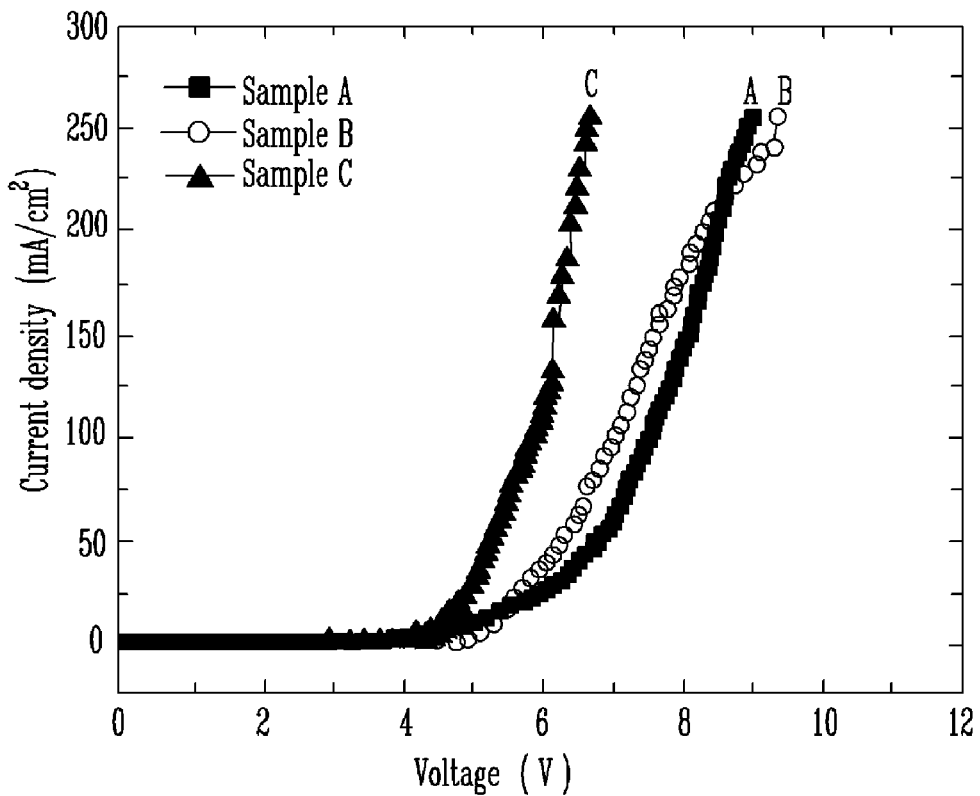

FIGS. 4A and 4B are graphs schematically illustrating the physical property values of organic light emitting displays as a function of the electron injection layer. FIG. 4A illustrates a correlation between the current density of the organic light emitting display and the brightness of the light being emitted. FIG. 4B illustrates a correlation between the driving voltage and the current density of the organic light emitting display. In FIGS. 4A and 4B, sample A does not have an electron injection layer, sample B has an electron injection layer of LiF, and sample C has an electron injection layer of MgO. As illustrated in FIGS. 4A and 4B, when an electron injection layer is used, the brightness of the organic light emitting display increases for the same current density, whereas the driving voltage thereof is reduced.

According to an embodiment of the present invention, the electron injection layer 180 can be formed of a material whose band gap is 3.4 eV to 5.0 eV, one selected from the group consisting of an oxide, a nitride, a fluoride, and diamond. For example, the electron injection layer 180 can be formed of MgO, $Al_2O_3$, $SiO_2$, $Si_3N_4$, or LiF. To reduce the thickness of the organic light emitting display, the thickness of the electron injection layer 180 can be 1 nm to 2 nm.

Furthermore, in order to help the transmission of electrons, depending on the materials of the cathode electrode 170 and the organic light emitting layer 190, an electron transport layer may further be formed on the electron injection layer 180. Also, a hole injection layer, a hole transport layer, or both of them can be further included to help hole injection and transmission between the organic light emitting layer 190 and the anode electrode 200, depending on the materials of the organic light emitting layer and the anode electrode.

Figure 5:
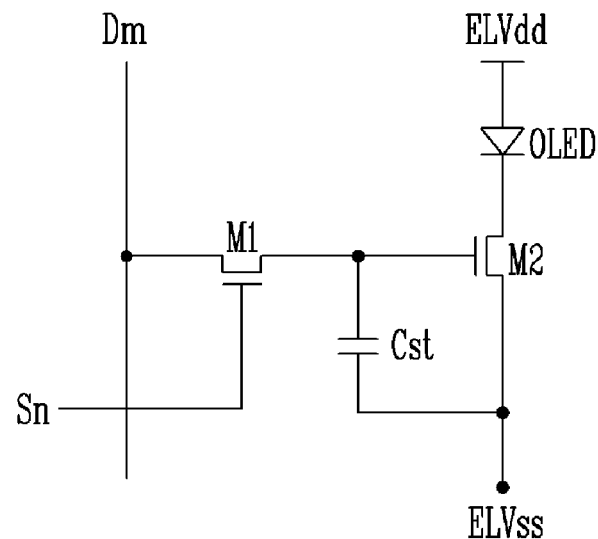
FIG. 5 is a circuit diagram illustrating a pixel circuit of the organic light emitting display including an N-type driving TFT according to an embodiment of the present invention.

Hereinafter, the pixel circuit of the organic light emitting display including the N-type driving TFT according to an embodiment of the present invention will be described with reference to, which is a circuit diagram illustrating the pixel circuit of the organic light emitting display including an N-type driving TFT according to an embodiment of the present invention. As illustrated in FIG. 5, the pixel circuit of the organic light emitting display includes a switching TFT M1, a driving TFT M2, a capacitor Cst, and an organic light emitting diode (OLED).

In this embodiment, the switching TFT M1 and the driving TFT M2 are formed of an N-type driving TFT. However, the present invention is not limited to this embodiment. That is, the switching TFT M1 can be either an N-type or P-type semiconductor. However, as in this embodiment, when the driving TFT M2 is an N-type driving TFT, the switching TFT M1 can also be an N-type driving TFT to facilitate manufacturing. The gate electrode of the switching TFT M1 is coupled to a scan line Sn to transmit a data voltage from a data line Dm coupled to a drain electrode to the gate of the driving TFT M2 in response to a selection signal from the scan line. The source electrode of the driving TFT M2 is coupled to a reference voltage ELVss, the gate electrode of the driving TFT M2 is coupled to the source electrode of the switching TFT M1, and the drain electrode of the driving TFT M2 is coupled to the cathode electrode of the OLED. The capacitor Cst is commonly coupled to the gate electrode of the driving TFT M2 and the source electrode of the driving TFT M2 to maintain a gate-source voltage VGS within a uniform range. In the OLED, the anode electrode is commonly coupled to a power source voltage ELVdd, and the cathode electrode is coupled to the drain of the driving TFT M2.

The operation of the pixel circuit according to this embodiment of the present invention will be described as follows. When the switching TFT M1 is turned on by the selection signal applied to the gate of the switching TFT M1 through the scan line, the data signal transmitted through the data line Dm is transmitted to the capacitor Cst so that the data signal is stored. Then, the data signal stored in the capacitor Cst is transmitted to the driving TFT M2. Therefore, the driving TFT M2 supplies driving current to the OLED through the cathode electrode in response to the applied data signal so that light is emitted.

While the present invention has been described in connection with certain example embodiments, various modifications can be performed within the spirit and scope of the invention. For example, the driving TFT has the inverted staggered structure in the above-described embodiment, but may be formed of an N-type oxide semiconductor in a top gate structure, a bottom gate structure, or a coplanar structure. In addition, in the above embodiment, a compensation circuit such as an additional threshold voltage can be further included in the pixel circuit of the organic light emitting display.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting display, comprising:
   a substrate;
   a driving thin film transistor (TFT) on the substrate, the TFT including a semiconductor layer formed of a source electrode, a drain electrode, and an N-type oxide semiconductor;
   at least one insulating layer formed on the driving TFT;
   a pixel defining layer defining a pixel region on the insulating layer;
   a cathode electrode coupled to a drain electrode of the driving TFT and patterned to correspond to the pixel region;
   an electron injection layer arranged on the cathode electrode over the entire surfaces of the pixel defining layer and the cathode electrode, and formed of a material whose band gaps are 3.4 eV to 5.0 eV selected from the group consisting of an oxide, a nitride, a fluoride, and diamond;
   an organic light emitting layer formed on the electron injection layer to correspond to the cathode region; and
   an anode electrode formed on the organic light emitting layer.

2. The organic light emitting display as claimed in claim 1, wherein the N-type oxide semiconductor is formed of an oxide selected from the group consisting of ZnO, $ZnGa_2O_4$, $ZnIn_2O_4$, $In_2O_3$, $ZnInGaO_4$, and $ZnSnO_4$.

3. The organic light emitting display as claimed in claim 1, wherein the cathode electrode is formed of a material selected from the group consisting of ITO, Ag, and Al.

4. The organic light emitting display as claimed in claim 1, wherein the electron injection layer is formed of a compound selected from the group consisting of MgO, $Al_2O_3$, $SiO_2$, $Si_3N_4$, and LiF.

5. The organic light emitting display as claimed in claim 1, wherein the electron injection layer has a thickness of 1 nm to 2 nm.

6. The organic light emitting display as claimed in claim 1, further comprising an electron transport layer between the electron injection layer and the organic light emitting layer.

7. The organic light emitting display as claimed in claim 1, wherein the substrate is transparent, and the cathode electrode is formed of ITO doped with Cs.

8. The organic light emitting display as claimed in claim 1, further comprising a switching TFT coupled to the gate electrode of the driving TFT.

9. The organic light emitting display as claimed in claim 8, wherein the switching TFT is an N-type TFT.

10. The organic light emitting display of claim 1, wherein the at least one insulating layer further comprises a planarizing layer and a passivation layer.

11. The organic light emitting display of claim 1, wherein the cathode electrode is coupled to the drain electrode through a via hole.

12. The organic light emitting display of claim 1, wherein at least one of a hole injection layer and a hole transport layer are disposed between the organic light emitting layer and the anode electrode.

13. The organic light emitting display of claim 8, wherein the switching TFT is a P-type TFT.

14. A pixel circuit of an organic light emitting display comprising:
   an N-type driving thin film transistor (driving TFT) with a gate electrode, drain electrode and source electrode;
   a switching thin film transistor (switching TFT) with a gate electrode, drain electrode and source electrode;
   a data line coupled to the drain electrode of the switching TFT;
   a scan line coupled to the gate electrode of the switching TFT;
   a capacitor coupled to the gate electrode of the driving TFT and the source electrode of the driving TFT, and
   an organic light emitting diode (OLED) with a cathode coupled to the drain electrode of the driving TFT and an anode coupled to a power voltage,
   wherein:
      the source electrode of the driving TFT is coupled to a reference voltage, and
      the gate electrode of the driving TFT is coupled to the source electrode of the switching TFT.

15. The pixel circuit of claim 14, wherein the switching TFT is an N-type TFT.

16. The pixel circuit of claim 14, wherein the switching TFT is a P-type TFT.

* * * * *